(12) United States Patent
Choi et al.

(10) Patent No.: US 7,211,951 B2
(45) Date of Patent: May 1, 2007

(54) CONNECTION STRUCTURE AND METHOD OF PLASMA DISPLAY PANEL

(75) Inventors: Yong Gi Choi, Kimhae-shi (KR); Soon Hak Kim, Kyoungsangbuk-do (KR); Seung Tea Park, Kumi-shi (KR)

(73) Assignee: LG Electronics Inc., Seoul (KR)

( * ) Notice: Subject to any disclaimer, the term of this patent is extended or adjusted under 35 U.S.C. 154(b) by 212 days.

(21) Appl. No.: 10/885,695

(22) Filed: Jul. 8, 2004

(65) Prior Publication Data
US 2005/0006650 A1    Jan. 13, 2005

(30) Foreign Application Priority Data
Jul. 9, 2003   (KR) ............... 10-2003-0046330

(51) Int. Cl.
*H01J 17/49* (2006.01)
(52) U.S. Cl. ...................... 313/582; 313/583
(58) Field of Classification Search ........ 313/582–587; 445/24, 25
See application file for complete search history.

(56) References Cited

U.S. PATENT DOCUMENTS 6,086,441 A * 7/2000 Akiguchi et al. .......... 445/24
6,249,264 B1 * 6/2001 Sano et al. ................. 345/60

FOREIGN PATENT DOCUMENTS

JP    2001-351535    12/2001

OTHER PUBLICATIONS

Chinese Search Report dated May 12, 2006.

* cited by examiner

*Primary Examiner*—Joseph Williams
(74) *Attorney, Agent, or Firm*—Ked & Associates, LLP

(57) ABSTRACT

A connection structure of a plasma display panel is provided that includes a first substrate having a plurality of panel-electrodes, a second substrate having a plurality of connecting-electrodes arranged to correspond to the panel-electrode, and a connection member located between the first substrate and the second substrate to directly connect the connecting-electrodes with the panel-electrodes upon compression.

24 Claims, 10 Drawing Sheets

CONNECTION STRUCTURE AND METHOD OF PLASMA DISPLAY PANEL

This application claims the benefit of the Korean Patent Application No. P2003-46330 filed on Jul. 9, 2003, which is hereby incorporated by reference.

BACKGROUND OF THE INVENTION

1. Field of the Invention

The present invention relates to a plasma display panel, and more particularly to a connection structure and method of a plasma display panel that electrically connects a panel substrate with a connection member such as anisotropic conductive film or a printed circuit board PCB with the connection member.

2. Description of the Related Art

Recently, the importance of image information has been increased following the development and diffusion of information processing system.

Display means, as the most principal man-machine interface of such image information, is becoming more important.

The display means can be applied to LCD, TV or AV monitor and computer display. Plasma Display Panel (hereinafter "PDP") among the display means has an advantage of being thin and light and being able to be made into a large size.

The PDP includes a set of a panel to generate electric discharge, a printed circuit board having a drive circuit to control the panel and other devices such as heatproof device.

Anisotropic Conductive Film ACF is used to electrically connect the panel and the printed circuit board.

FIG. 1 is a diagram representing the electrical connection between a panel substrate and a flexible substrate in a general PDP. FIG. 2 is a diagram representing an anisotropic conductive film stuck onto the flexible substrate of FIG. 1. FIG. 3 is a diagram representing the structure of the anisotropic conductive film of FIG. 2.

Referring to FIGS. 1 to 3, a plurality of flexible substrates 2 for signal connection are stuck to a panel substrate 1 of rectangular shape. An anisotropic conductive film ACF 3 is stuck to the end of the flexible substrate 2 in order to adhere the panel substrate 1 to the flexible substrate 2, thus the end of the panel substrate 1 and the end of the flexible substrate 2 are stuck to each other and, at the same time, electrically connected to each other.

The anisotropic conductive film 3 used at this moment has a double layer structure of epoxy resin 5 including conductive balls 4 as shown in FIG. 3. Herein, the reference numeral '6' represents PET resin to protect the anisotropic conductive film 3.

FIG. 4 is a diagram representing that a panel substrate is connected to a flexible substrate by use of an anisotropic conductive film of prior art.

As shown in FIG. 4, an anisotropic conductive film 13 and a flexible substrate 14, e.g., Chip On Film COF, Flexible Printed Circuit Film FPC, are mounted on a glass substrate 11.

A silicon rubber 16 is put on the flexible substrate 14 mounted in this way, and then pressure is applied to the flexible substrate 14 by use of a heat compression head 17 of a compressor (not shown). Herein, the silicon rubber 16 is a buffer to prevent the panel substrate 11 from being damaged by the pressure applied by the compressor.

Then, as pressure is applied to the flexible substrate 14, a copper CU electrode 15 and an address electrode 12 of the panel substrate 11 are located having conductive balls 4 therebetween, wherein the conductive balls 4 exist in the anisotropic conductive film 13.

At this moment, the epoxy resin of the anisotropic conductive film 13 fills a space area where the copper electrode 15 and the address electrode 12 are not located, i.e., which is formed between the copper electrodes 15 and between the address electrodes 12.

Accordingly, the panel substrate 11 and the flexible substrate 14 are electrically connected by the conductive balls 4, and they are insulated by the epoxy resin between the copper electrodes 15 and between the address electrodes 12.

However, in case of connecting the panel substrate with the flexible substrate in use of the anisotropic conductive film containing the conductive balls as above, when the epoxy resin of the anisotropic conductive film 13 is pressed upon compression, as shown in FIG. 5, some of the conductive balls 4 dispersed therewithin are used for electrical connection but the others are pushed aside to be gathered at the end of the flexible substrate 14.

In this way, the gathered conductive balls form an electrical line, thereby frequently causing a short circuit.

Also, in the connection structure of prior art that the panel substrate is electrically connected with the flexible substrate by use of the conductive balls, it is possible to be electrically connected by the conductive balls, but such conductive balls cause the cohesiveness of the electrode of the panel substrate and the electrode of the flexible substrate to be weak, so there is high degree of possibility that the connection part breaks away.

SUMMARY OF THE INVENTION

Accordingly, it is an object of the present invention to provide a connection structure and method of a plasma display panel that is adaptive for electrical connection without using conductive balls.

It is another object of the present invention to provide a connection structure and method of a plasma display panel that is adaptive for increasing connection cohesiveness by having the electrode of a flexible substrate protruded to penetrate the electrode of a panel substrate.

In order to achieve these and other objects of the invention, a connection structure of a plasma display panel according to an aspect of the present invention includes a first substrate having a plurality of panel-electrodes; a second substrate having a plurality of connecting-electrodes arranged to correspond to the panel-electrodes; and a connection member located between the first substrate and the second substrate to directly connect the connecting-electrodes with the panel-electrodes upon compression.

In the connection structure, the connecting-electrode has a projected shape with an angle in the connection member direction.

In the connection structure, the connecting-electrode has a projected shape with a curved surface in the connection member direction.

In the connection structure, the connecting-electrode penetrates into the inside of the panel-electrode upon compression.

In the connection structure, the second substrate is an anisotropic conductive film FPC, a chip-on-film COF and a chip-on-glass COG.

In the connection structure, the panel-electrode is an address electrode if the first substrate is a lower substrate.

In the connection structure, the panel-electrode is a bus electrode if the first substrate is an upper substrate.

In the connection structure, the connection member is made of any one among an epoxy resin with no conductive ball therein, a styrene resin with no conductive ball therein, an urethane resin with no conductive ball therein, a phenol resin with no conductive ball therein and a silicon resin with no conductive ball therein.

A connection method of a plasma display panel according to another aspect of the present invention includes the steps of: mounting a second substrate on a first substrate, wherein the first substrate includes a plurality of panel-electrodes and the second substrate includes a plurality of connecting-electrodes and a connection member made of a resin material with no conductive ball therein; aligning the connecting-electrodes with the panel-electrodes to correspond to each other; and directly connecting the connecting-electrodes with the panel-electrodes by having pressure applied to the second substrate for the connecting-electrodes to penetrate the epoxy resin.

In the connection method, the connecting-electrode has a projected shape with an angle in the connection member direction.

In the connection method, the connecting-electrode has a projected shape with a curved surface in the connection member direction.

In the connection method, the connecting-electrode penetrates into the inside of the panel-electrode.

In the connection method, the second substrate is an anisotropic conductive film FPC, a chip-on-film COF and a chip-on-glass COG.

In the connection method, the panel-electrode is one of an address electrode or a bus electrode.

In the connection method, the resin material is one among an epoxy resin, a styrene resin, an urethane resin, a phenol resin and a silicon resin.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

With reference to FIGS. 6 to 10, embodiments of the present invention will be explained as follows.

Figure 1:
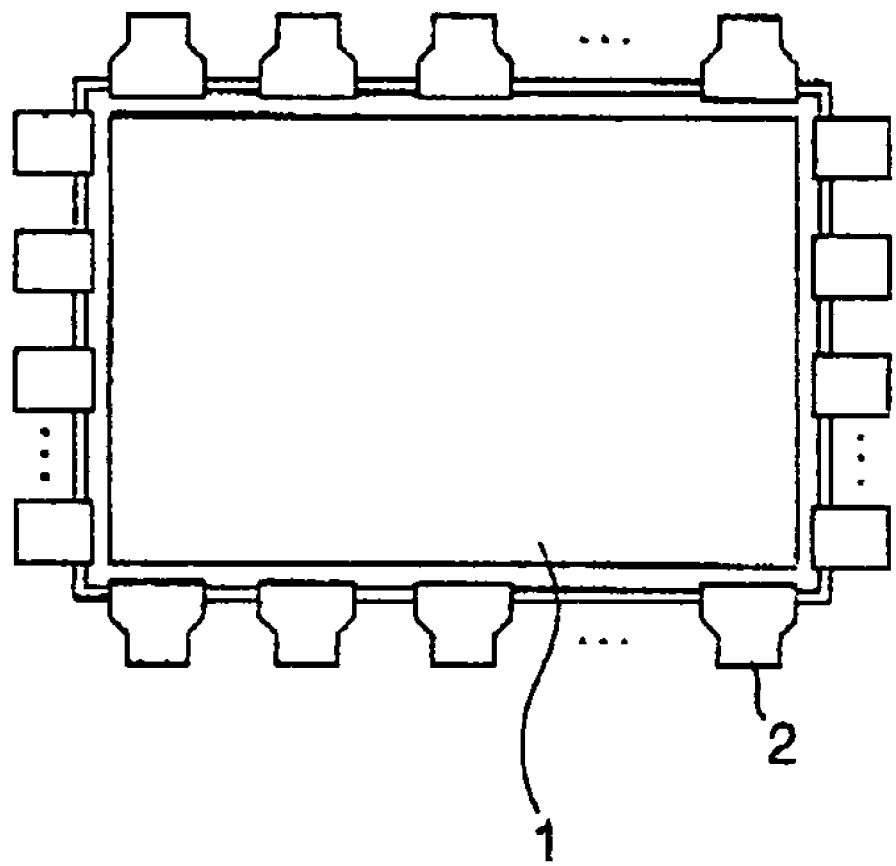
FIG. 1 is a diagram representing that a panel substrate is electrically connected with a flexible substrate in a general PDP.
Figure 2:
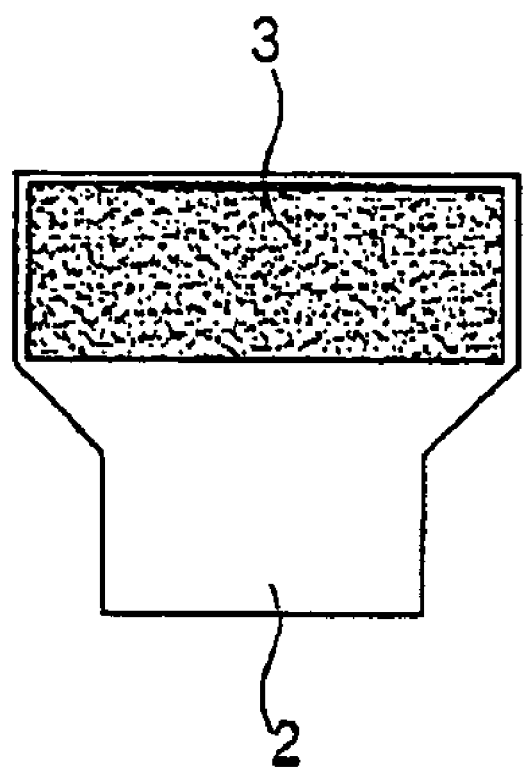
FIG. 2 is a diagram representing an anisotropic conductive film stuck onto the flexible substrate of FIG. 1.
Figure 3:
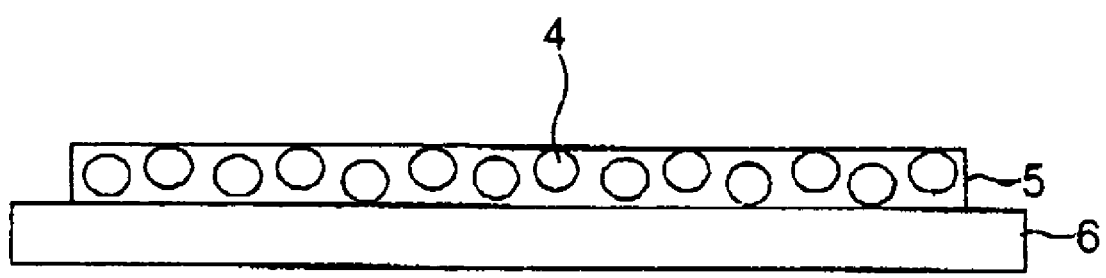
FIG. 3 is a diagram representing the structure of the anisotropic conductive film of FIG. 2.
Figure 4:
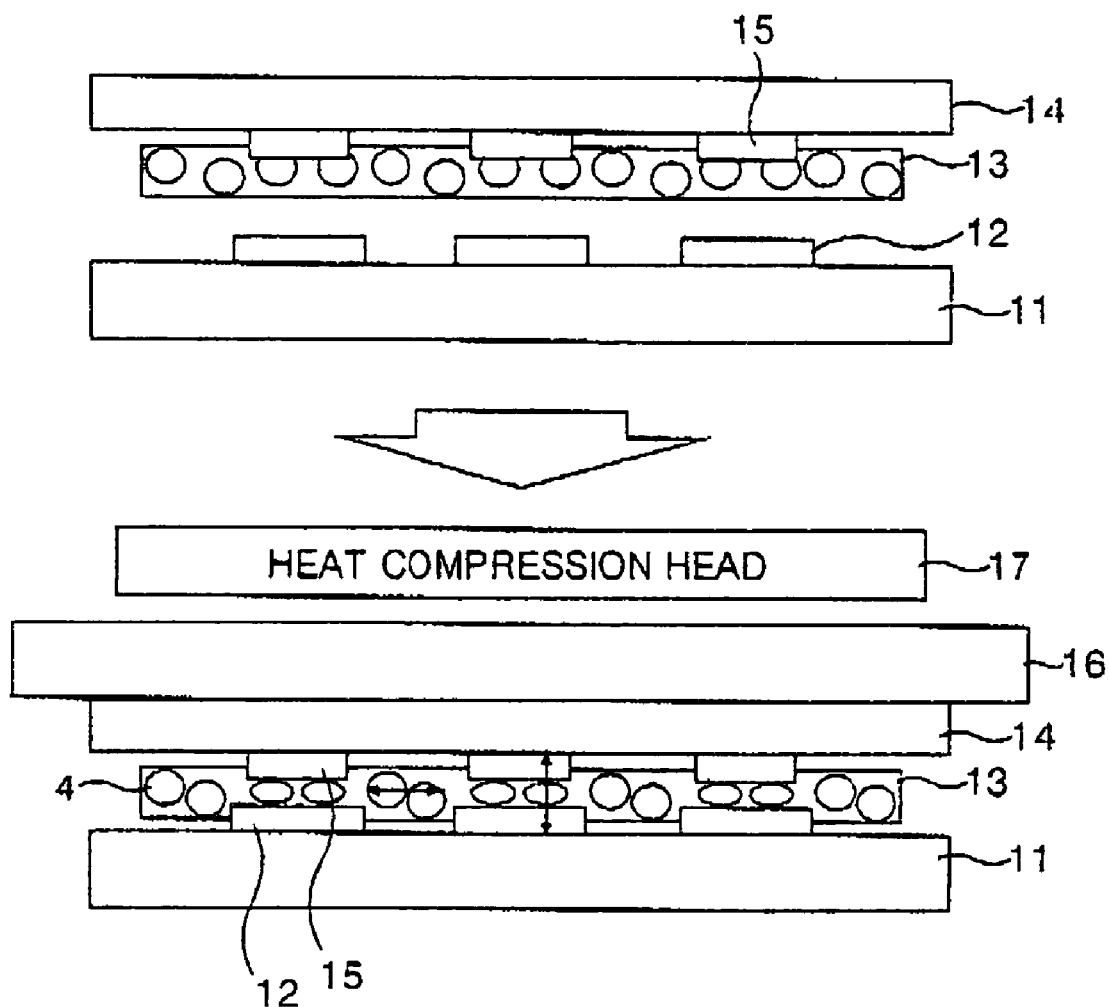
FIG. 4 is a diagram representing that a panel substrate is connected with a flexible substrate by use of an anisotropic conductive film of prior art.
Figure 5:
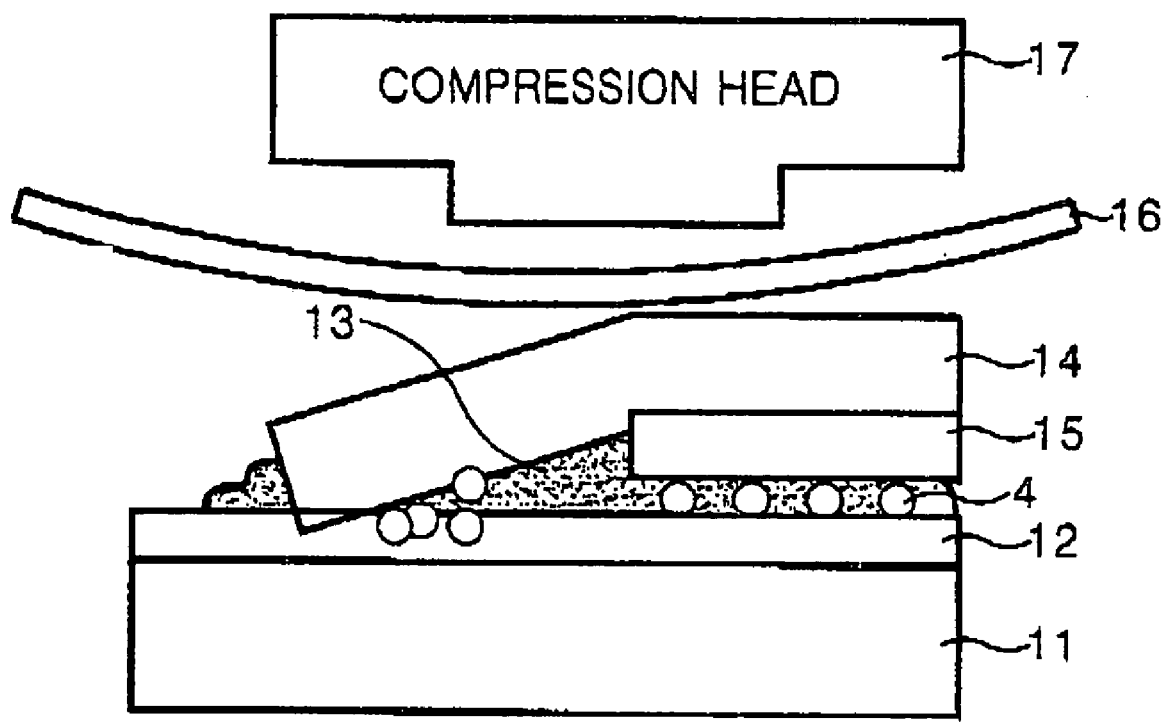
FIG. 5 is a diagram representing that there occurs a conductive ball mass in case that a panel substrate is connected with a flexible substrate by use of an anisotropic conductive film of prior art.
Figure 6:
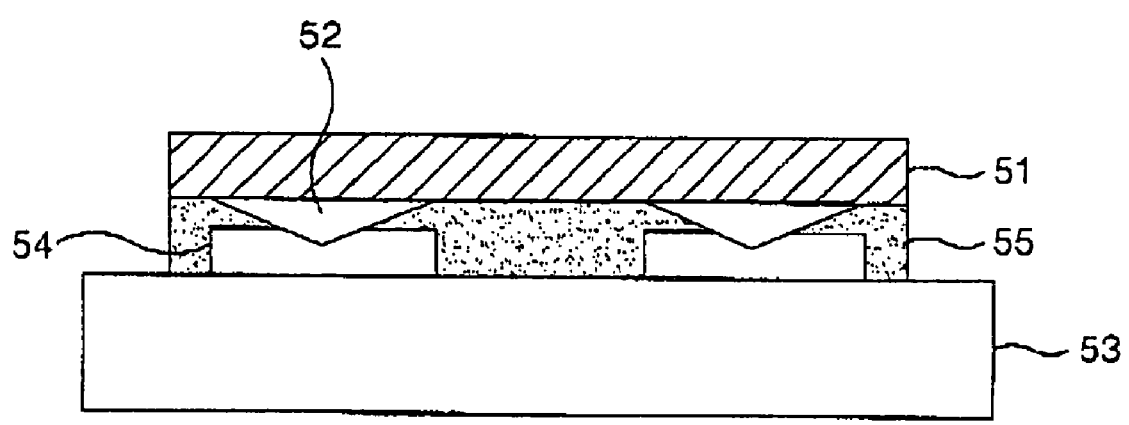
FIG. 6 is a diagram representing a connection structure of a plasma display panel according to a desirable embodiment of the present invention.

FIG. 6 is a diagram representing the connection structure of a plasma display panel according to a desirable embodiment of the present invention.

Referring to FIG. 6, the connection structure of a plasma display panel according to the present invention is desirable to include a panel substrate 53, a flexible substrate 51 and a connection member 55. The panel substrate 53 includes a plurality of panel-electrodes 4. The flexible substrate 51 includes a plurality of connection-electrodes, e.g., copper electrodes 52, arranged to correspond to the panel-electrodes 54. The connection member 55 is located between the panel substrate 53 and the flexible substrate 51 and, upon compression, guides the connection-electrode to be connected directly with the panel-electrode 54 (address electrode or bus electrode). At this moment, the connection member 55 is desirable to be made of any one of the epoxy resin with no conductive ball therein, the styrene resin with no conductive ball therein, the urethane resin with no conductive ball therein, the phenol resin with no conductive ball therein and the silicon resin with no conductive ball therein.

Hereunder, the connection member 55 is described as being limited to the anisotropic conductive film ACF, however the connection member of the present invention is not only limited to the anisotropic conductive member but it might include an isotropic conductive film as well.

To describe in more detail, the panel substrate 53 might be a lower substrate or an upper substrate of a plasma display panel. At this moment, in case that the panel substrate 53 is the lower substrate, the panel-electrode 54 is an address electrode. And, if the panel substrate 3 is the upper substrate, the panel-electrode 54 is a bus electrode.

The flexible substrate 51 might be one of Flexible Printed Circuit Film FPC, Chip On Film COF and Chip On Glass COG.

Figure 8:
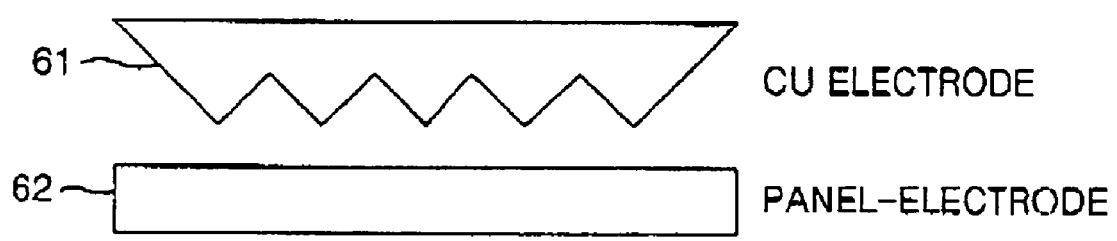
FIG. 8 is an exemplary diagram representing the shape of a copper electrode included in a flexible substrate of the present invention.

At this moment, a copper electrode 52 formed in the flexible substrate 51 might have a projected shape with an angle in the anisotropic conductive film 55 direction. That is, as shown in FIG. 8, the copper electrode 61 might have a plurality of triangular shapes within the width of the panel-electrode 62. At this moment, the triangular shapes can be uniform, or the triangular shapes in the middle can be formed to be bigger than the triangular shapes in the edge.

The copper electrode 61 of the projected shape with such an angle penetrates the panel-electrode 62 corresponding thereto upon compression to increase the connection cohesiveness of the panel-electrode 62 and the copper electrode 61, thereby preventing the panel substrate from being separated from the flexible substrate due to weak cohesiveness or prior art.

Figure 9:
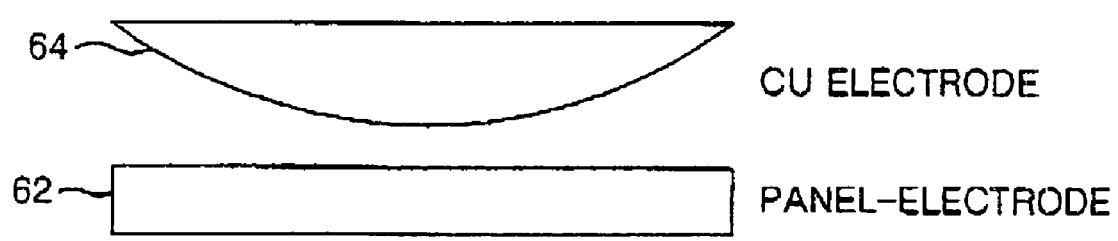
FIG. 9 is another exemplary diagram representing the shape of a copper electrode included in the flexible substrate of the present invention.
Figure 10:
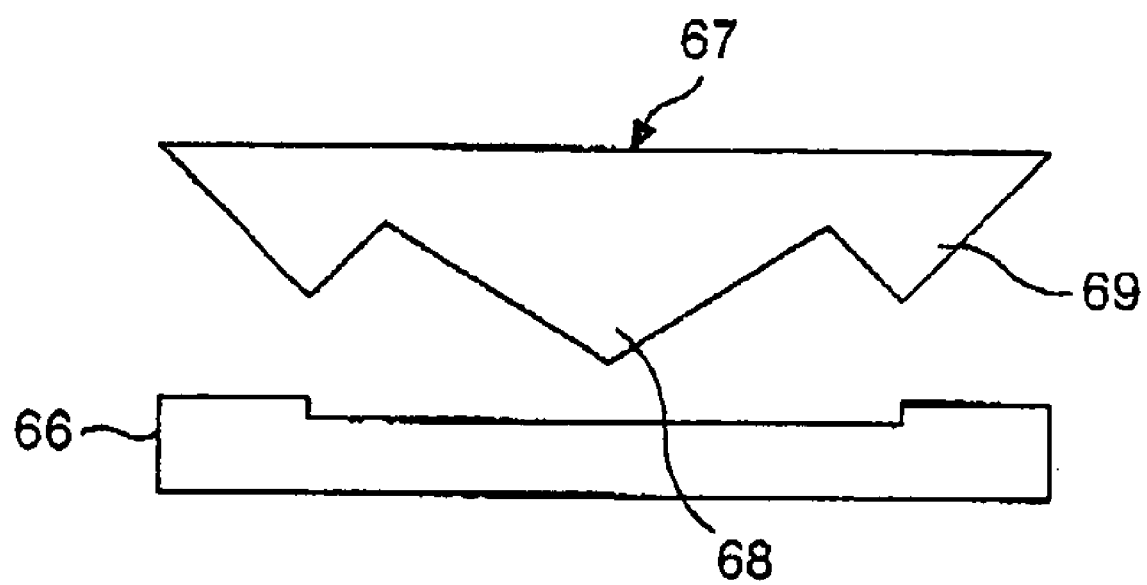
FIG. 10 is still another exemplary diagram representing the shape of a copper electrode of a flexible substrate corresponding to an electrode for a panel formed in the shape of edge-curl in the present invention.

Also, the copper electrode 52 might have a projected shape with a curved surface in the anisotropic conductive film 55 direction. That is, as shown in FIG. 9, the copper electrode 64 might be formed to be projected in a smooth curved surface (semi-oval or semicircle) that it is biggest in its middle part and gets smaller gradually.

In this way, the copper electrode 64 has a projected shape with a curved surface, thus its contact surface is maximized with the panel-electrode 62 upon compression to restrain the electrical resistance component in the connection part to the highest degree, thereby improving its conductive capacity.

On the other hand, generally, if the panel electrode 66 is formed on the panel substrate, the edge of the panel electrode 66 is formed in an edge-curl shape. That is, the edge of the panel electrode 66 is formed to be high and, as it gets to the middle, it is formed to be low (refer to FIG. 10)

In this way, in order to correspond to the panel electrode 66, the copper electrode 67 is formed to have a projected shape with an angle at each of a middle part 68 and both edge parts 69 but the projected shape of the middle part 68 is made to be bigger than the projected shape of both edge parts 69.

Accordingly, the projected shape formed at the middle part 68 and both edge parts 69 uniformly penetrates the panel-electrode 66, thereby improving the connection cohesiveness more.

There is an operation process for making the connection structure of the plasma display panel as above.

Figure 7:
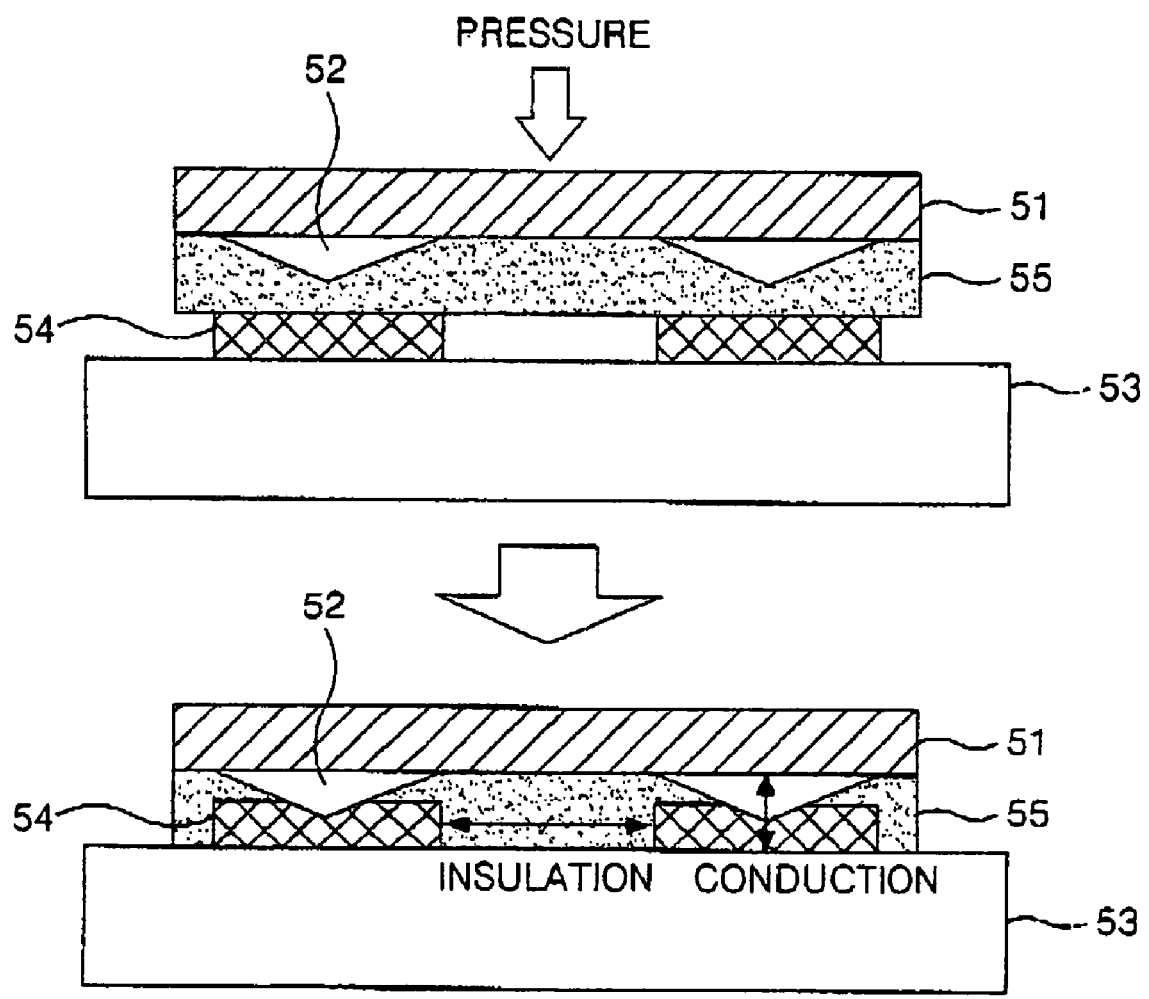
FIG. 7 is a diagram representing that a panel substrate is connected with a flexible substrate by use of an anisotropic conductive film according to a desirable embodiment of the present invention.

FIG. 7 is a diagram representing that a panel substrate is connected with a flexible substrate by use of an anisotropic conductive film according to a desirable embodiment of the present invention.

Firstly, there is a panel substrate 53 including a plurality of panel-electrodes 54, an anisotropic conductive film 55 made of epoxy resin with no conductive ball therein, and a flexible substrate 51 including a plurality of copper electrodes 52.

The anisotropic conductive film 55 and the flexible substrate 51 are mounted in turn on the panel substrate 53 provided in this way.

Next, alignment is conducted by use of an alignment device (not shown) for each of the panel-electrodes 54 to correspond to the copper electrodes 52.

If the panel-electrodes 54 are each correspondingly aligned with the copper electrodes 52, pressure is applied to the flexible substrate 51 by use of a heat compression device.

That is, the flexible substrate 51 is pressed by the compression head of the heat compression device, and accordingly, the copper electrode 52 of the flexible substrate 51 penetrates the epoxy resin of the anisotropic conductive film 55 and is directly connected to the panel-electrode 54 of the panel substrate 53. In other words, whereas the panel-electrode is indirectly connected to the copper electrode by the conductive balls in the prior art, in the present invention, because there is no conductive ball in the anisotropic conductive film 55, the copper electrode 52 of the flexible substrate 51 penetrates the epoxy resin and is directly connected to the panel-electrode 54 of the panel substrate 53.

In addition, the copper electrode 52 connected to the panel-electrode 54 in this way gradually penetrates the panel-electrode 54 at a designated depth as pressure increases and time passes by. At this moment, it is not within the scope of the present invention how deep the copper electrode 52 penetrates, thus it will not described further, but only if the copper electrode 52 penetrates the panel-electrode 54 at a designated depth in this invention, there will be no obstacle in realizing this invention.

So far the present invention is described about the connection structure of the plasma display panel, but the present invention is not limited to this, but attention should be given to the fact that it can be applicable to all display devices such as LCD and EL etc that require to be electrically connected by use of the flexible substrate including the copper electrode having a projected shape with an angle and the anisotropic conductive film with no conductive ball therein.

As described above, the connection structure and method of the plasma display panel according to the present invention uses the connection member with no conductive ball therein, thereby preventing the occurrence of short circuit caused by the conductive ball mass of prior art. Also, the conductive ball like this is not used, so that it is expected to have an effect of saving material cost more than before.

Also, the connection structure and method of the plasma display panel according to the present invention has the copper electrode of the flexible substrate formed in a projected shape with an angle, so the copper electrode penetrates the panel-electrode of the panel substrate, thereby improving the connection cohesiveness between the flexible substrate and the panel substrate.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A connection structure of a plasma display panel, comprising:
   a first substrate having a plurality of panel-electrodes;
   a second substrate having a plurality of connecting-electrodes arranged to correspond to the panel-electrodes; and
   a connection member located between the first substrate and the second substrate to directly connect the connecting-electrodes with the panel-electrodes upon compression, wherein each of the connecting-electrodes has a triangular shape such that a point of each triangular shape directly connects to a different one of the panel-electrodes upon compression.

2. The connection structure according to claim 1, wherein each of the connecting-electrodes penetrates into an inside of a corresponding one of the panel-electrodes upon compression.

3. The connection structure according to claim 1, wherein the second substrate includes one of an anisotropic conductive film FPC, a chip-on-film COF or a chip-on-glass COG.

4. The connection structure according to claim 1, wherein each of the panel-electrodes is an address electrode and the first substrate is a lower substrate.

5. The connection structure according to claim 1, wherein each of the panel-electrodes is a bus electrode and the first substrate is an upper substrate.

6. The connection structure according to claim 1, wherein the connection member is made of one of an epoxy resin with no conductive ball therein, a styrene resin with no conductive ball therein, an urethane resin with no conductive ball therein, a phenol resin with no conductive ball therein or a silicon resin with no conductive ball therein.

7. The connection structure according to claim 1, wherein at least one of the connecting-electrodes has a plurality of triangular shapes that directly connect to one of the panel-electrodes upon compression.

8. A connection structure of a plasma display panel, comprising:
- a first substrate having a plurality of panel-electrodes;
- a second substrate having a plurality of connecting-electrodes arranged to correspond to the panel-electrodes; and
- a connection member located between the first substrate and the second substrate to directly connect the connecting-electrodes with the panel-electrodes upon compression, wherein each of the connecting-electrodes has a curved surface such that each curved surface directly connects to a different one of the panel-electrodes upon compression.

9. The connection structure according to claim 8, wherein each of the connecting-electrodes penetrates into an inside of the panel-electrode upon compression.

10. The connection structure according to claim 8, wherein the second substrate includes one of an anisotropic conductive film (FPC), a chip-on-film (COF) or a chip-on-glass (COG).

11. The connection structure according to claim 8, wherein each of the panel-electrodes is an address electrode and the first substrate is a lower substrate.

12. The connection structure according to claim 8, wherein each of the panel-electrodes is a bus electrode and the first substrate is an upper substrate.

13. The connection structure according to claim 8, wherein the connection member is made of one of an epoxy resin with no conductive ball therein, a styrene resin with no conductive ball therein, an urethane resin with no conductive ball therein, a phenol resin with no conductive ball therein or a silicon resin with no conductive ball therein.

14. A connection method of a plasma display panel, comprising:
- mounting a second substrate on a first substrate, wherein the first substrate includes a plurality of panel-electrodes and the second substrate includes a plurality of connecting-electrodes and a connection member made of a resin material with no conductive ball therein is provided between the first substrate and the second substrate;
- aligning the connecting-electrodes with the panel-electrodes to correspond to each other; and
- directly connecting the connecting-electrodes with the panel-electrodes by having pressure applied to the second substrate for the connecting-electrodes to penetrate the resin, wherein each of the connecting-electrodes has a curved surface such that each curved surface directly connects to a corresponding one of the panel-electrodes.

15. The connection method according to claim 14, wherein each of the connecting-electrodes penetrates into an inside of the panel-electrode.

16. The connection method according to claim 14, wherein the second substrate includes one of an anisotropic conductive film FPC, a chip-on-film COF or a chip-on-glass COG.

17. The connection method according to claim 14, wherein each of the panel-electrodes is one of an address electrode or a bus electrode.

18. The connection method according to claim 14, wherein the resin material is one of an epoxy resin, a styrene resin, an urethane resin, a phenol resin or a silicon resin.

19. A connection method of a plasma display panel, comprising:
- mounting a second substrate on a first substrate wherein the first substrate includes a plurality of panel-electrodes and the second substrate includes a plurality of connecting-electrodes and a connection member made of a resin material with no conductive ball therein is provided between the first substrate and the second substrate;
- aligning the connecting-electrodes with the panel-electrodes to correspond to each other; and
- directly connecting the connecting-electrodes with the panel-electrodes by having pressure applied to the second substrate for the connecting-electrodes to penetrate the resin, wherein each of the connecting-electrodes has a triangular shape such that a point of each triangular shape directly connects to a corresponding one of the panel-electrodes.

20. The connection method according to claim 19, wherein each of the connecting-electrodes penetrates into an inside of a corresponding one of the panel-electrodes.

21. The connection method according to claim 19, wherein the second substrate includes one of an anisotropic conductive film (FPC), a chip-on-film (COF) or a chip-on-glass (COG).

22. The connection method according to claim 19, wherein each of the panel-electrodes is one of an address electrode or a bus electrode.

23. The connection method according to claim 19, wherein the resin material is one of an epoxy resin, a styrene resin, an urethane resin, a phenol resin or a silicon resin.

24. The connection method according to claim 19, wherein at least one of the connecting-electrodes has a plurality of triangular shapes that directly connect to one of the panel-electrodes upon compression.

\* \* \* \* \*